(12) United States Patent
Kim et al.

(10) Patent No.: US 7,485,910 B2
(45) Date of Patent: Feb. 3, 2009

(54) SIMPLIFIED VERTICAL ARRAY DEVICE DRAM/EDRAM INTEGRATION: METHOD AND STRUCTURE

(75) Inventors: Deok-kee Kim, Bedford Hills, NY (US); Ramachandra Divakaruni, Ossining, NY (US); Carl J. Radens, LaGrangeville, NY (US); Dae-Gyu Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 10/907,630

(22) Filed: Apr. 8, 2005

(65) Prior Publication Data

US 2006/0226481 A1    Oct. 12, 2006

(51) Int. Cl.
*H01L 27/108* (2006.01)
(52) U.S. Cl. .................. 257/302; 257/300; 257/301; 257/E27.096; 438/259
(58) Field of Classification Search .......... 257/300, 257/301, 302, E27.096; 438/259
See application file for complete search history.

(56) References Cited

U.S. PATENT DOCUMENTS

| | | | |
|---|---|---|---|
| 4,816,884 A | 3/1989 | Hwang et al. | |
| 4,833,516 A | 5/1989 | Hwang et al. | |
| 5,225,363 A | 7/1993 | Riemenschneider et al. | |
| 5,365,097 A | 11/1994 | Kenney | |
| 5,396,093 A | 3/1995 | Lu | |
| 5,433,794 A | 7/1995 | Fazan et al. | |
| 5,541,427 A | 7/1996 | Chappell et al. | |
| 5,627,092 A * | 5/1997 | Alsmeier et al. ............ | 438/152 |
| 5,869,392 A | 2/1999 | Kimura | |
| 5,953,607 A | 9/1999 | Hakey et al. | |
| 6,025,245 A | 2/2000 | Wei | |
| 6,136,686 A | 10/2000 | Gambino et al. | |
| 6,153,902 A | 11/2000 | Furukawa et al. | |
| 6,174,756 B1 | 1/2001 | Gambino et al. | |
| 6,222,218 B1 | 4/2001 | Jammy et al. | |
| 6,228,711 B1 | 5/2001 | Hsieh | |
| 6,238,961 B1 | 5/2001 | Asano et al. | |
| 6,287,913 B1 | 9/2001 | Agnello et al. | |
| 6,350,653 B1 | 2/2002 | Adkisson et al. | |
| 6,403,423 B1 | 6/2002 | Weybright et al. | |
| 6,437,401 B1 * | 8/2002 | Mandelman et al. ........ | 257/330 |
| 6,509,226 B1 | 1/2003 | Jaiprakash et al. | |
| 6,548,344 B1 | 4/2003 | Beintner et al. | |
| 6,610,573 B2 | 8/2003 | Weis | |

(Continued)

OTHER PUBLICATIONS

Parker, C. G., Ultrathin Oxide-Nitride Gate Dielectric MOSFET's, IEEE Electron Device Letters, vol. 19, No. 4, Apr. 1998, pp. 106-108.*

*Primary Examiner*—David Vu
*Assistant Examiner*—Earl N Taylor
(74) *Attorney, Agent, or Firm*—Scully, Scott, Murphy & Presser, P.C.; Lisa U. Jaklitsch, Esq.

(57) ABSTRACT

The present invention provides a semiconductor structure that includes an active wordline located above a semiconductor memory device and a passive wordline located adjacent to said active wordline and above an active area of a substrate. In accordance with the present invention, the passive wordline is separated from the active area by a pad nitride. The present invention also provides methods that are capable of forming the inventive semiconductor structure.

17 Claims, 19 Drawing Sheets

U.S. PATENT DOCUMENTS

| | | |
|---|---|---|
| 6,620,676 B2 | 9/2003 | Malik et al. |
| 6,635,526 B1 | 10/2003 | Malik et al. |
| 6,727,540 B2 | 4/2004 | Divakaruni et al. |
| 6,750,097 B2 | 6/2004 | Divakaruni et al. |
| 6,787,838 B1 | 9/2004 | Chidambarrao et al. |
| 6,790,739 B2 | 9/2004 | Malik et al. |
| 2003/0003653 A1 | 1/2003 | Malik et al. |
| 2003/0062568 A1* | 4/2003 | Beintner ............... 257/330 |
| 2003/0143809 A1 | 7/2003 | Hummler |
| 2003/0186502 A1 | 10/2003 | Malik et al. |
| 2004/0036100 A1 | 2/2004 | Divakaruni et al. |
| 2004/0066666 A1 | 4/2004 | Chidambarrao et al. |
| 2004/0219758 A1* | 11/2004 | Birner et al. ............ 438/389 |
| 2004/0256665 A1* | 12/2004 | Birner et al. ............ 257/329 |
| 2005/0247966 A1* | 11/2005 | Adkisson et al. ......... 257/301 |

* cited by examiner

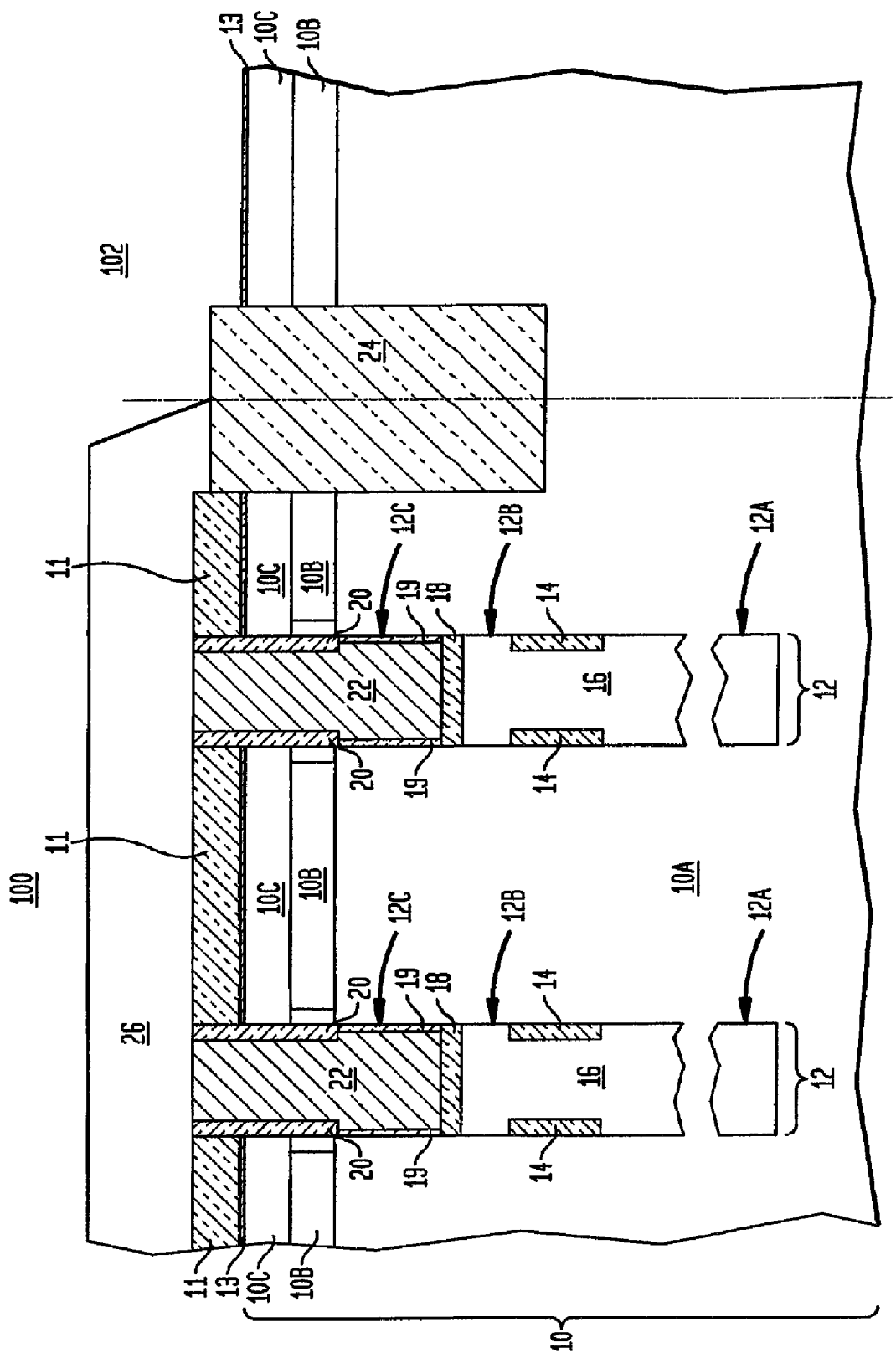

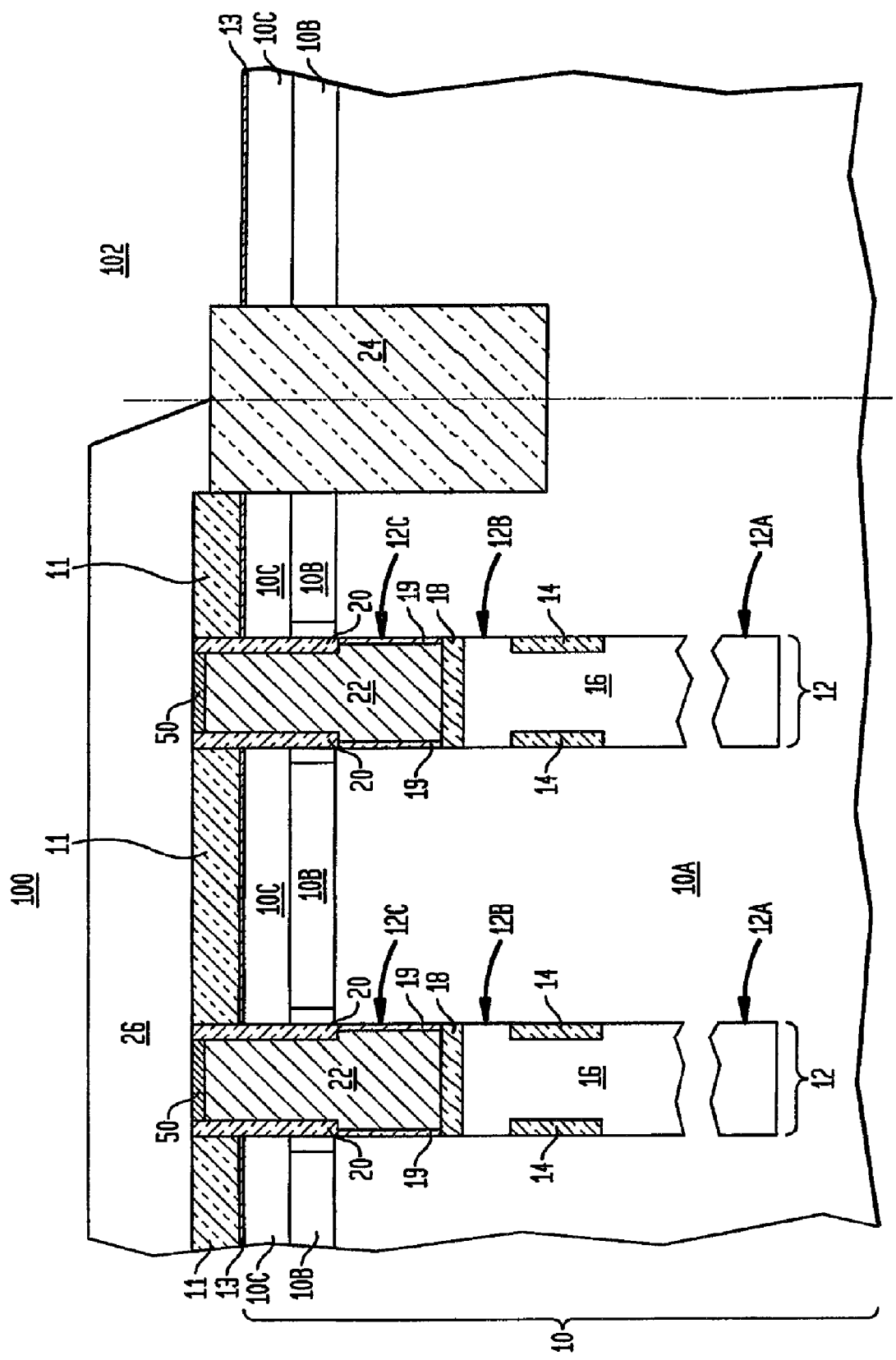

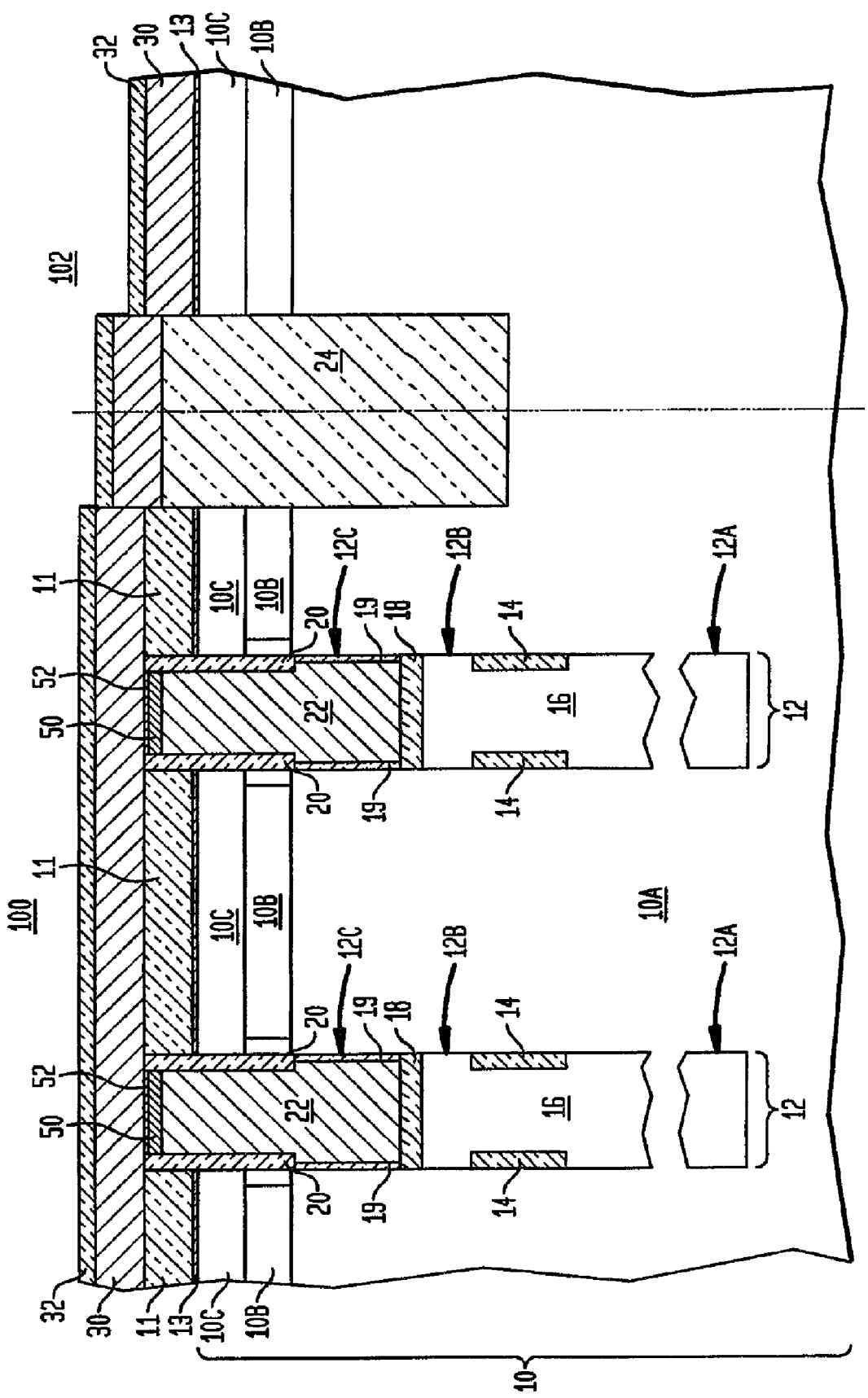

SIMPLIFIED VERTICAL ARRAY DEVICE DRAM/EDRAM INTEGRATION: METHOD AND STRUCTURE

FIELD OF THE INVENTION

The present invention relates to a semiconductor structure comprising at least one array region that includes at least one semiconductor memory device such as a dynamic random access memory (DRAM) or an embedded dynamic random access memory (eDRAM) and methods of fabricating the same. In accordance with the present invention, a pad nitride is used to isolate the passive wordline in the array region from the active area of the substrate thereby avoiding the use of an array top oxide which is typically used in the prior art.

BACKGROUND OF THE INVENTION

The manufacture and design of integrated circuits has greatly increased in sophistication in recent years, particularly in regard to the increase of current density. Increased integration density leads to economic advantages as an increased number of devices and circuits are placed on a single chip and/or within a single package (which may include a plurality of chips). Performance improvements such as, for example, reduced signal propagation time and noise immunity can typically be achieved as integration density is increased due to a reduction in the length of signal paths and reduction in capacitance between connections. This performance gain is particularly important in integrated circuits (ICs).

ICs such as dynamic random access memory (DRAM) can have millions of similar devices on a single chip (often collectively referred to as an array or an array portion of the chip design) which are controlled throughout the chip portions thereof by circuits such as addressing circuits, sense amplifiers and the like, generally referred to as support circuits. Unfortunately, the circuit requirements are generally different for the array and support regions of the chip, and ideally would require different processes during manufacturing. For example, junctions with self-aligned silicides (e.g., salicides) are desired in the support regions to minimize series resistance. On the other hand, shallow junctions with low dose implants and no silicides are typically desired in the array in order to minimize junction leakage.

As another example, during conventional processing of the array for DRAM/eDRAM with vertical array devices, an array top oxide is deposited and certain portions are thereafter removed. Generally, the array top oxide is removed entirely from the support array. See, for example, R. Divakaruni, et al. "In ULSI Process Integration II", Electrochemical Society Proceeding Col. 2, 2001. However, existing wet etch processes may cause shallow trench isolation areas within the support area to be exposed to overetching which, in turn, may lead to voids at the trench edges, gate shorts and the like.

As indicated above, array top oxides including oxynitrides are known to be used in the fabrication of semiconductor memory with vertical array devices. See, for example, U.S. Pat. No. 6,509,226 to Jaiprakash, et al., U.S. Pat. No. 6,635,526 to Malik, et al., U.S. Pat. No. 6,727,540 to Divakaruni, et al., U.S. Pat. No. 6,787,838 to Chiadambarrao, et al., and U.S. Pat. No. 6,790,739 to Malik, et al. as well as U.S. Printed Application Publication No. 2003/0143809 A1 to Hummler. Although various processes of fabricating semiconductor memory devices that include array top oxides are known, processes that use array top oxides add additional processing steps, and thus cost to the overall manufacturing process.

A method of fabricating semiconductor structures comprising vertical array semiconductor memory devices such as DRAMs and eDRAMs is needed which avoids the use of an array top oxide. Such a method would simplify the fabrication of semiconductor structures including vertical array semiconductor memory devices, and thus reduce the overall production cost of fabricating the same.

SUMMARY OF THE INVENTION

The present invention provides a semiconductor structure including vertical array semiconductor devices such as DRAM and eDRAM in which no array top oxide is present in either the array region or the support region. In the present method, a pad nitride is used as the isolating material between a passing wordline and the active area in the array region thus eliminating the need of using an array top oxide.

In broad terms, the semiconductor structure of the present invention comprises:

a semiconductor substrate including at least one array region and at least one support region, said semiconductor substrate having an upper active area;

a semiconductor memory device located in a deep trench that is present in said semiconductor substrate in each array region;

an active wordline located above said semiconductor memory device and a passive wordline located adjacent to said active wordline and above said active area, wherein said passive wordline is separated from said active area by a pad nitride.

In addition to providing the semiconductor structure mentioned above, the present invention also relates to methods of fabricating the same. In accordance with the present invention, no array top oxide is employed therefore the problems with using array top oxides, as discussed above, are obviated. Specifically and in broad terms, one method of the present invention comprises the steps of:

providing a structure comprising a semiconductor substrate having an upper active area, at least one array region and at least one support region, said structure including a semiconductor memory device located in a deep trench that is present in said semiconductor substrate in each array region and a pad nitride located above said upper active area of said semiconductor substrate in both said array and support regions;

selectively removing at least said pad nitride from said support region exposing said upper active area of said substrate;

forming a material stack comprising a gate dielectric, a gate conductor and a hardmask on said structure in both said array and support regions;

providing at least one support device in said at least one support region, while removing said hardmask and said gate conductor in said at least one array region;

forming a silicide region atop said semiconductor memory device in said at least one array region, while forming at least a silicide region atop said active area in said at least one support device region; and forming an active wordline above the silicide region on said semiconductor memory device, while simultaneously forming at least a passive wordline above said pad nitride in said at least one array region adjacent to said active wordline.

A second method of the present invention comprises the steps of:

providing a structure comprising a semiconductor substrate having an upper active area, at least one array region and at least one support region, said structure including a semiconductor memory device comprising an upper conductive cap layer located in a deep trench that is present in said semiconductor substrate in each array region and a pad nitride located above said upper active area of said semiconductor substrate in both said array and support regions;

selectively removing at least said pad nitride from said support region exposing said upper active area of said substrate;

forming a material stack comprising at least a gate conductor and a hardmask on said structure in both said array and support regions;

patterning said material stack in both said array and support regions to provide at least a first patterned material stack atop said conductive cap layer of said semiconductor memory device and a second patterned material stack located atop said pad nitride in said array region; and etching portions of the conductive cap layer atop said semiconductor memory device and recessing the exposed portion of the semiconductor memory device, whereby said first patterned material stack is an active wordline, and the second patterned material stack is a passive wordline.

BRIEF DESCRIPTION OF THE DRAWINGS

FIGS. 1A-1I are pictorial representations (through cross sectional views) illustrating the basic processing steps used in one embodiment of the present invention.

FIGS. 3A-3I are pictorial representations (through cross sectional views) illustrating the basic processing steps used in a second embodiment of the present invention.

DETAILED DESCRIPTION OF THE INVENTION

Figure 1A:
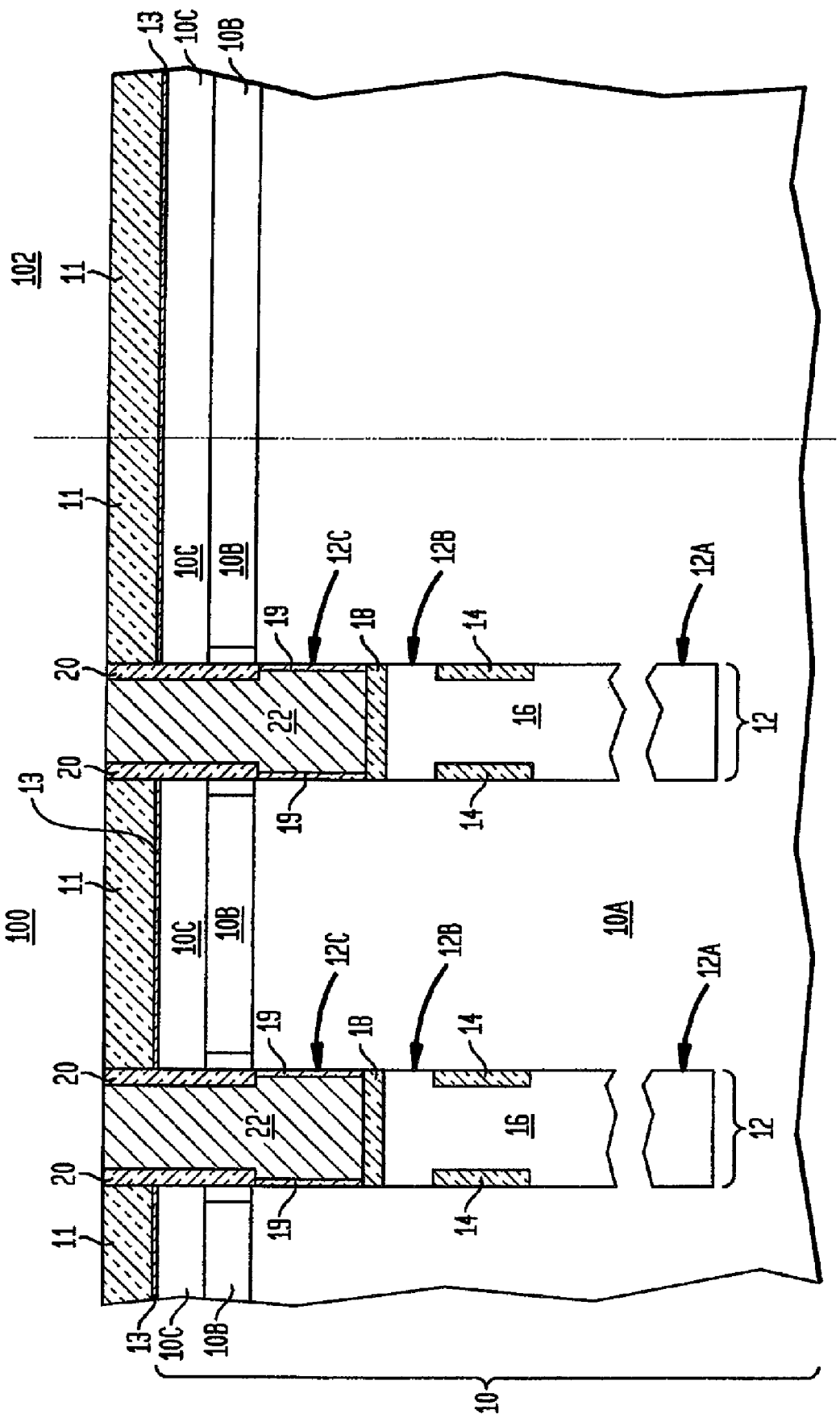

The present invention, which provides a semiconductor structure including vertical array semiconductor memory devices such as DRAMs and eDRAMS in which no array top oxide is present as well as methods of fabricating the same, will now be described in greater detail by referring to the drawings that accompany the present application. It is noted that the drawings of the present application are provided for illustrative purposes and thus the drawings are not drawn to scale.

Before discussing the basic processing steps of the present invention, it is noted that each of the cross sectional drawings includes a silicon-on-insulator (SOI) as the semiconductor substrate 10. The SOI substrate includes a lower semiconductor substrate 10A, a buried insulating region 10B and an upper Si-containing layer 10C. The upper Si-containing layer 10C is the active area in which devices are typically formed. Although an SOI substrate is shown and described, the present invention works equally well with bulk semiconductor substrates including, for example, Si, SiGe, SiC, SiGeC, GaAs, InAs, InP and all other III/V compound semiconductors. Layered semiconductor substrates including Si/SiGe are also contemplated herein. The substrate 10 may be doped (p- or n-type) depending on the type of memory cell being fabricated. The term "Si-containing" includes a semiconductor substrate that includes silicon, e.g., one of Si, SiGe, SiC or SiGeC. The buried insulating region 10B includes crystalline or noncrystallines oxides, nitrides or oxynitrides. Typically, the buried insulating region 10B comprises a buried oxide (BOX).

Also, the cross sectional views provided herein emphasize the middle section 12B and the upper section 12C of a deep trench 12; the lower section 12A of the deep trench is not fully shown in the drawings of the present application. The term "deep trench" denotes a trench having a depth from the upper surface of substrate 10 of about 5 μm or greater. As known to those skilled in the art, the deep trench 12 is the region in which a vertical semiconductor memory device will be formed. The lower section 12A includes the capacitor (not shown) of the semiconductor memory device, the upper section 12C includes the vertical transistor of the semiconductor memory device and the middle section provides isolation between the capacitor and transistor, which are typically in electrical contact through buried strap diffusion regions (not shown).

The formation of the capacitor present in the lower section 12A of the deep trench 12 is performed using techniques that are well known to those skilled in the art and thus no details concerning the fabrication of the trench capacitor are provided herein. As known to those skilled in the art, the trench capacitor typically includes a buried plate electrode, a node dielectric and a trench electrode. These elements are conventional and well known in the art.

The middle section 12B which provides isolation between the trench capacitor and the vertical transistor is also fabricated using techniques well known in the art. The middle section 12B typically includes a collar region 14 including a collar oxide, nitride and/or oxynitride, a trench fill material, e.g., polysilicon, 16, and an oxide layer 18.

The upper section 12C including the vertical transistor comprises a gate dielectric 19 (oxide, nitride and/or oxynitride) that is present on the vertical sidewalls of the trench 12 in the upper trench section 12C, a trench gate conductor 22 and nitride gate spacers 20. The vertical transistor is fabricated using conventional techniques well known in the art. The trench gate conductor 22 includes a conductive material such as a metal, a metal alloy or polysilicon. Of these conductive materials, the trench gate conductor 22 is typically comprised of polySi.

U.S. Pat. No. 6,509,226 to Jaiprakash, et al., U.S. Pat. No. 6,548,344 to Beintner, et al., U.S. Pat. No. 6,620,676 to Malik, et al., U.S. Pat. No. 6,635,526 to Malik, et al., U.S. Pat. No. 6,727,540 to Divakaruni, et al., U.S. Pat. No. 6,787,838 to Chiadambarrao, et al., and U.S. Pat. No. 6,790,739 to Malik, et al. as well as U.S. Printed Application Publication No. 2003/0143809 A1 to Hummler provide details of fabricating a semiconductor memory device that can be used herein in providing the same. The entire contents of each of the aforementioned references are thus incorporated herein by reference in their entirety.

FIG. 1A shows the initial structure that is used in the present invention. The initial structure includes a semiconductor substrate 10 that includes at least one array region 100 and at least one support region 102. The at least one array region 100 is the area of the semiconductor substrate 10 in which at least one memory device is to be fabricated, and the at least one support region 102 is the area in which at least one support device such as a field effect transistor (FET) or bipolar transistor is formed.

Unlike the prior art methods in which an array top oxide is formed on the surface of the semiconductor substrate prior to forming the array and support devices, the initial structure shown in FIG. 1A replaces the array top oxide with a pad nitride 11 that is formed on a pad oxide 13 that is present on a surface of substrate 10 prior to forming the array and support devices. The pad nitride 11 is formed by a deposition process such as, for example, chemical vapor deposition, plasma enhanced chemical vapor deposition, evaporation, chemical solution deposition, atomic layer deposition, and other like deposition processes. Alternatively, the pad nitride 11 can be formed by a thermal nitridation process. The thickness of the pad nitride 11 can vary depending on the technique that was used in forming the same. Typically, the pad nitride 11 has a thickness from about 50 nm to about 250 nm, with a thickness from about 80 nm to about 120 nm being more typical.

Prior to forming the pad nitride 11, a pad oxide 13 is typically formed directly on the surface of the substrate 10. The pad nitride 11 is formed by a conventional deposition process such as chemical vapor deposition or plasma enhanced chemical vapor deposition. Alternatively, the pad oxide 13 is formed by a thermal oxidation process. The pad oxide 13 has a thickness that is less than that of the pad nitride 11. The thickness of the pad oxide 13 is not sufficient for isolation proposes.

After forming the pad oxide 13 and the pad nitride 11 across the surface of substrate 10, the array device, e.g. DRAM or eDRAM, is formed in a deep trench 12 using conventional techniques well known in the art. This includes lithography and etching of the deep trench, forming a trench capacitor in the lower section 12A of the deep trench, forming an isolation region in the middle section 12B of the deep trench 12, and then forming a vertical transistor in the upper section 12C of the deep trench. During the formation of the transistor in the upper section of the deep trench, a divot filled region can be formed to provide communication between the active area 10C and the gate dielectric 19.

Figure 1B:
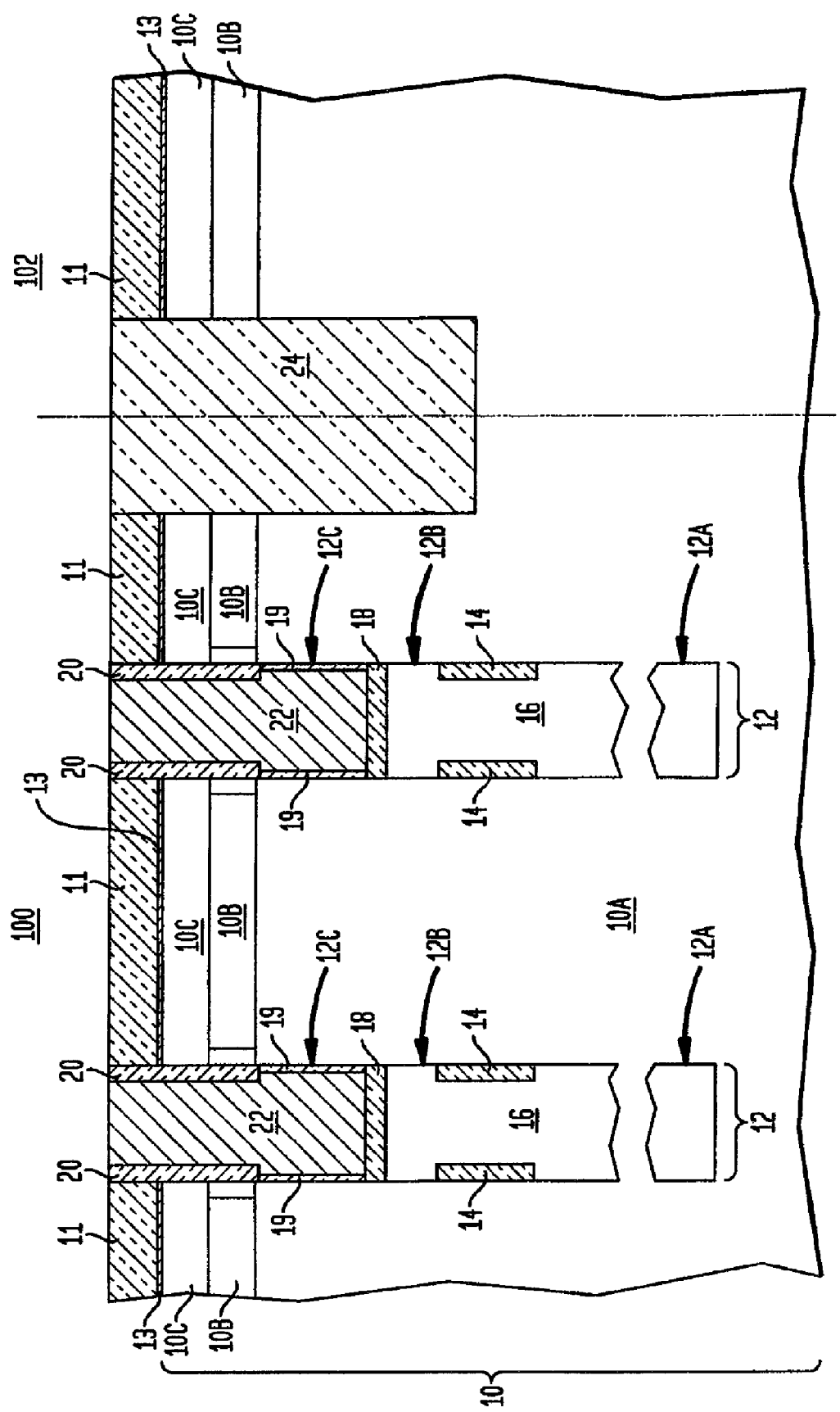

After providing the initial structure shown in FIG. 1A, a trench isolation region 24 is formed between the array region 100 and the support region 102 providing the structure shown, for example, in FIG. 1B. The trench isolation region 24 is formed by first applying a photoresist (not shown) atop the entire surface of the initial structure shown in FIG. 1A and then patterning the photoresist by conventional lithography which includes a step of exposing the photoresist to a desired pattern of radiation and developing the exposed photoresist with a conventional resist developer. The pattern is typically a trench pattern which is then transferred into the initial structure by utilizing one or more etching steps. The etching used in forming the trench isolation region 24 may include a dry etching process (including reactive ion etching, plasma etching, ion beam etching and/or laser ablation), a wet chemical etching process or a combination thereof. In some embodiments, the patterned photoresist can be removed after the pattern is initially transferred into the pad nitride 11.

After forming the trench into the structure, the trench is filled with a trench dielectric material such as an oxide, and then the filled trench is subjected to a conventional planarization process such as chemical mechanical polishing and/or grinding. A trench liner such as $Si_3N_4$, TiN or TaN may be formed into the isolation trench prior to filling the same with the trench dielectric.

Next, the structure shown in FIG. 1B is subjected to a deglazing step that removes any native oxides that may be formed on the surface of the pad nitride 11 during the processing steps used in forming the structure shown in FIG. 1A. The deglazing step is performed utilizing an etchant such as hot HF that selectively removes oxide without damaging the surface of the nitride pad 11. Following deglazing, a block mask 26 is formed on the array region 100 of the semiconductor substrate 10 such as is shown, for example in FIG. 1C. The block mask 26 includes any conventional resist material and it is formed by first applying a resist material to the structure shown in FIG. 1B and then subjecting the applied resist material to lithography. The block mask 26 protects the pad nitride 11 that is located in the array region 100, while leaving the pad nitride 11 in the support region 102 exposed.

The exposed pad nitride 11 in the support region 102 is then removed utilizing an etching process that selectively removes nitride, stopping on oxide and semiconductor material. An example of an etching process that can be used to selectively remove the exposed pad nitride 11 in the support region 102 is a dry etching process (including reactive ion etching, plasma etching, ion beam etching and/or laser ablation), a wet chemical etching process or a combination thereof. The resultant structure including the block mask 26 located on top of the pad nitride 11 in the array region 100, and the removed pad nitride 11 in the support region 102 is shown, for example, in FIG. 1C. Note that in the support region 102, a portion of the trench isolation region 24 and the pad oxide 13 on active area 10C, is exposed.

After removing the pad nitride 11 from the support region 102, at least one support device such as a field effect transistor (FET) is then formed on the exposed surface of the substrate 10 utilizing conventional CMOS processing steps well known to those skilled in the art. Specifically, the FET is formed in the support region 102 by first removing pad nitride 11, and then implanting diffusion regions (also not shown) into the active area of the substrate 10 that is located in the support region 102. In some embodiments, the pad oxide 13 is removed in region 102 prior to implanting the diffusion regions. In such an embodiment, a sacrificial oxide is formed prior to implanting and the sacrificial layer is removed after the implant step. The pad oxide 13 is typically removed from the support region 102 following the implantation process. An activation anneal may follow the implant step as is known to those skilled in the art.

Figure 1D:
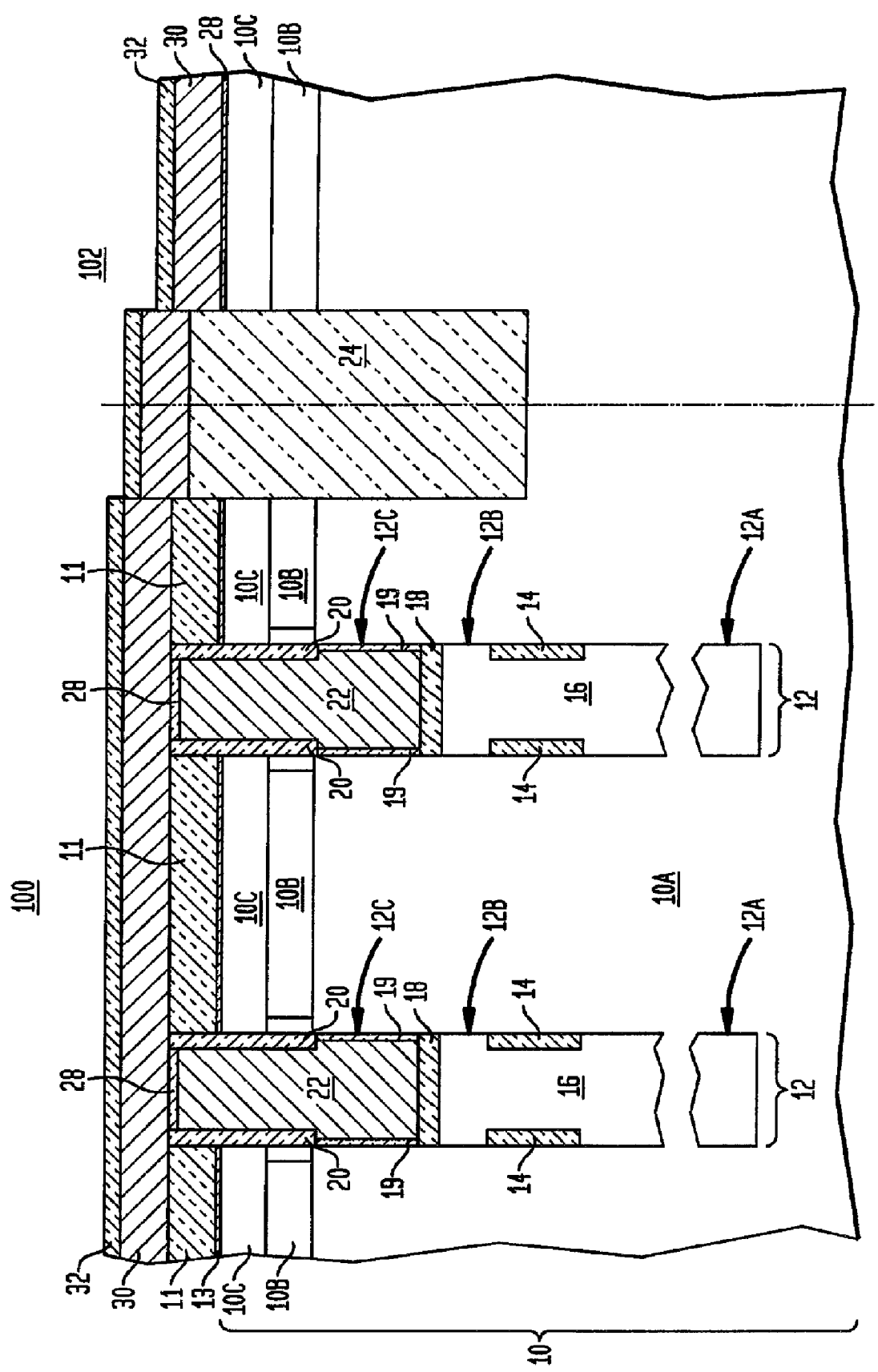

A material stack including a gate dielectric 28, a gate conductor 30, and a hardmask 32 is then formed over the entire structure providing the structure shown, for example, in FIG. 1D. The gate dielectric 28 includes any insulating material including oxides, nitrides and/or oxynitrides, preferably oxide, while the gate conductor 30 comprises any conductive material including metals, metal alloys and polysilicon, preferably polysilicon. The gate dielectric 28 is located atop any exposed surface of the semiconductor substrate 10 as well as atop the trench gate conductor 22. The hardmask 32 employed in the present invention typically comprises an oxide. The gate dielectric 28 is formed utilizing a conventional deposition process or by a thermal means, while the gate conductor 30 and the hardmask 32 are formed by conventional deposition processes.

Figure 1E:
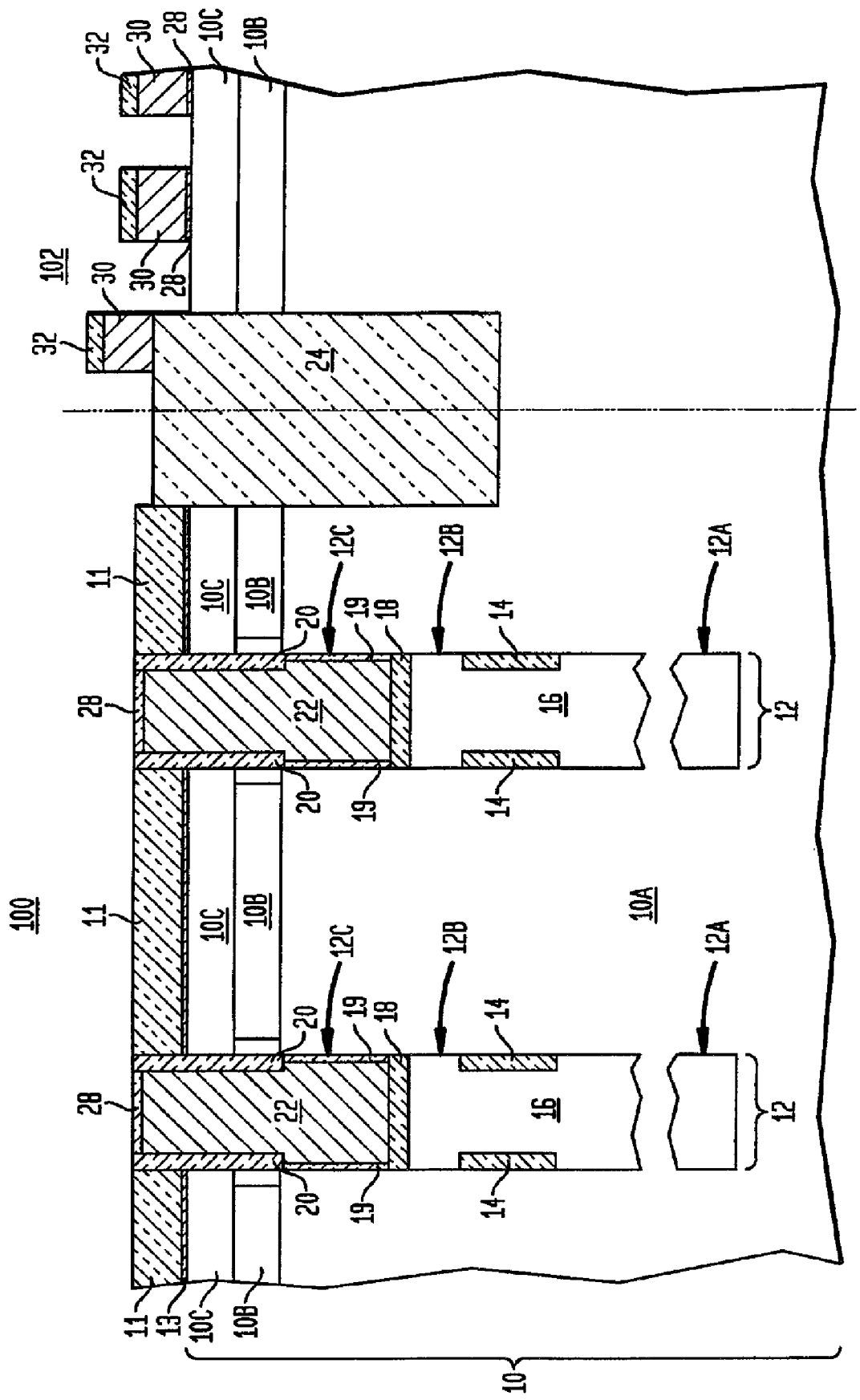

Next, a patterned resist (not shown) is formed atop the hardmask 32 that has openings in both the array region 100 and support region 102 which exposes surface portions of the hardmask 32. The exposed portions of the hardmask 32 (in both the array region 100 and the support region 102) are removed utilizing an etching process that selectively removes oxide, stopping on the gate conductor 30. The patterned resist is then removed utilizing a conventional stripping process and the exposed portions of the gate conductor 30 (in both the array region 100 and the support region 102) are removed utilizing an etching process that selectively removes the conductive material. This etching step opens the array region 100. The resultant structure including the opened array region 100 is shown in FIG. 1E. Note that in the array region 100, the gate dielectric 28 remains of the exposed portions of the trench gate conductor 22.

Figure 1F:
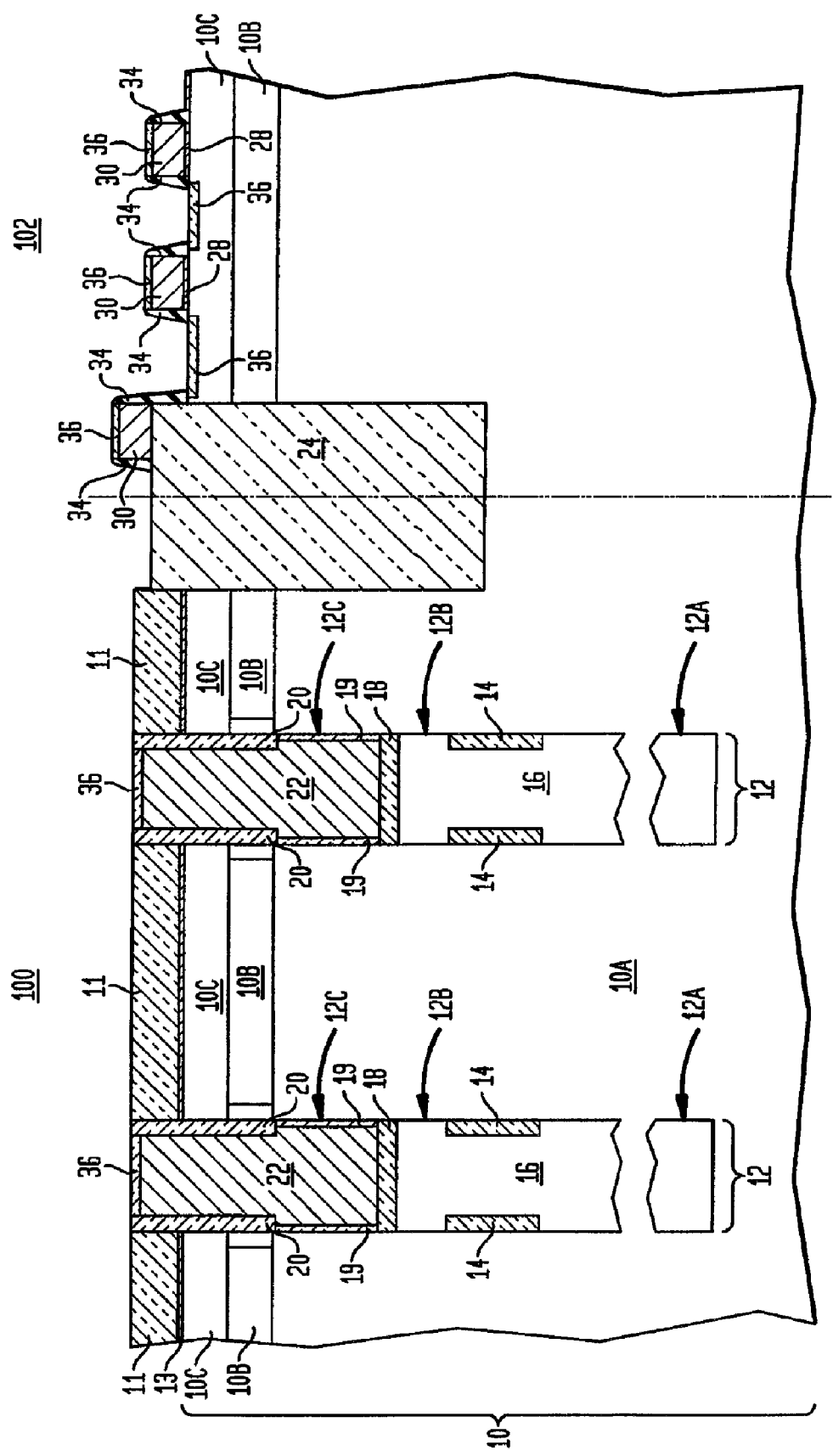
Figure 16:
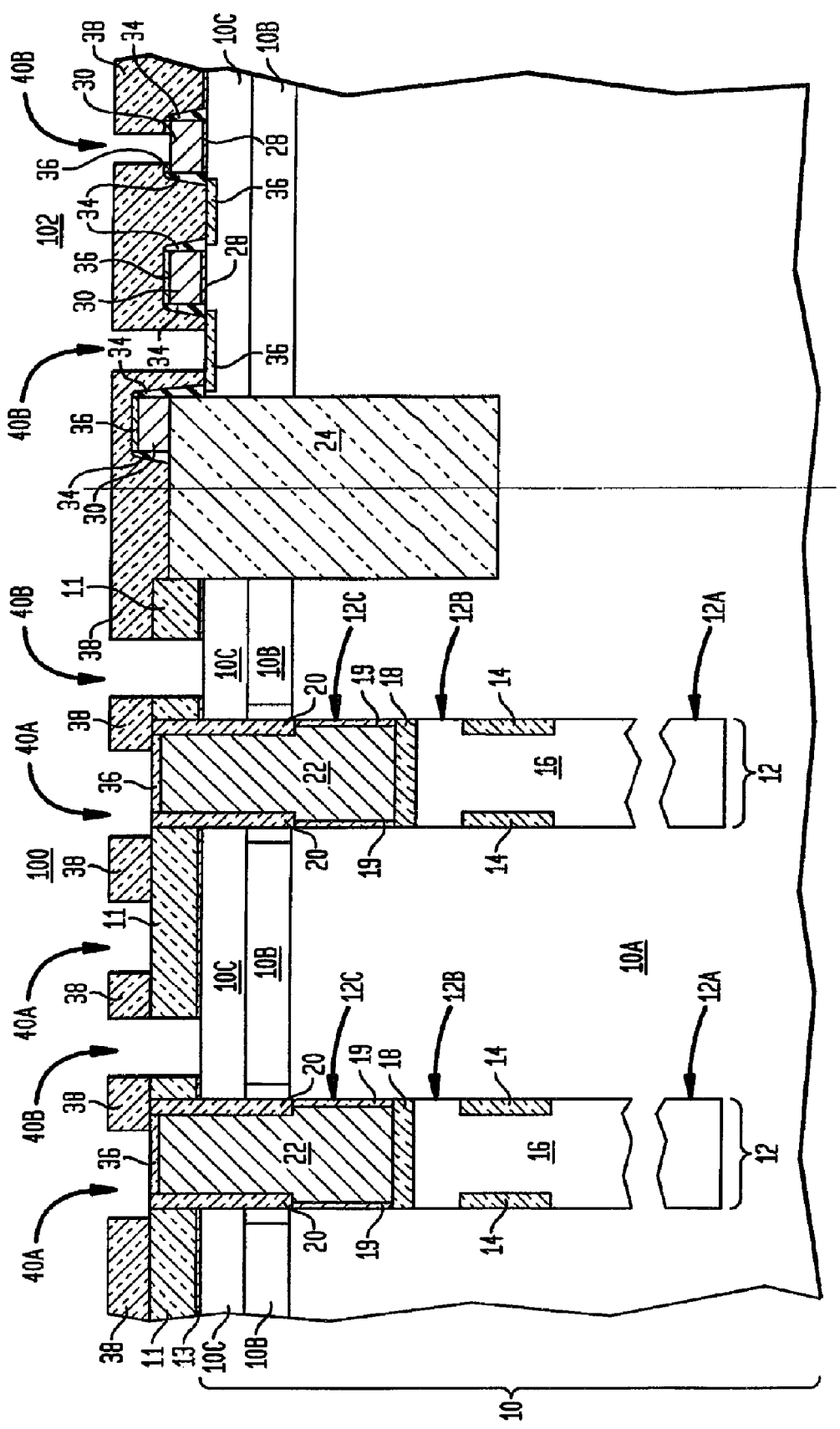

FIG. 1F shows the structure after further processing of the FETs in the support device region 102. Specifically, the structure shown in FIG. 1F is formed after first removing the remaining portions of the hardmask 32 from atop the gate conductor 30 in the support region 102. During removal of the hardmask, the gate dielectric 28 is typically removed from the array region 100. Next, the exposed sidewalls of the gate conductor 30 can be passivated by performing a conventional gate re-oxidation process. Insulating spacers 34 are then formed by deposition and etching and the exposed portions of the semiconductor substrate 10 as well as the trench gate conductor 22, are then subjected to a silicidation process that is capable of forming a silicide region 36. The silicidation process includes forming a silicide metal such as Ti, Co or Ni atop the exposed Si-containing material and then annealing. If the substrate 10 or the trench gate conductor 22 is not composed of Si, a Si-containing layer can be formed prior to forming the silicide metal. W, Co, Ni, Ti, Pt and NiPt are examples of silicide metals that can be used in the present invention.

A dielectric material 38 such as a silicate glass is then formed atop the structure shown in FIG. 1F utilizing a conventional deposition process. Openings including wordline openings 40A and metal contact openings 40B, are formed by lithography and etching. Dopants are then implanted within active areas 10C of the substrate 10 in the array region 100 utilizing a masked ion implantation process to increase doping through the contact openings 40B. A conductive material such as W is formed into the wordline openings 40A. This latter embodiment is not shown in the drawing. The resultant structure that is formed is shown, for example, in FIG. 1G. In the present invention, the wordlines openings 40A above the deep trench 12 including the memory device will be used in forming the active wordline of the structure. The wordline opening 40A above the pad nitride 11 in the array region 100 will be used in forming the passive wordline of the inventive structure.

Figure 1H:
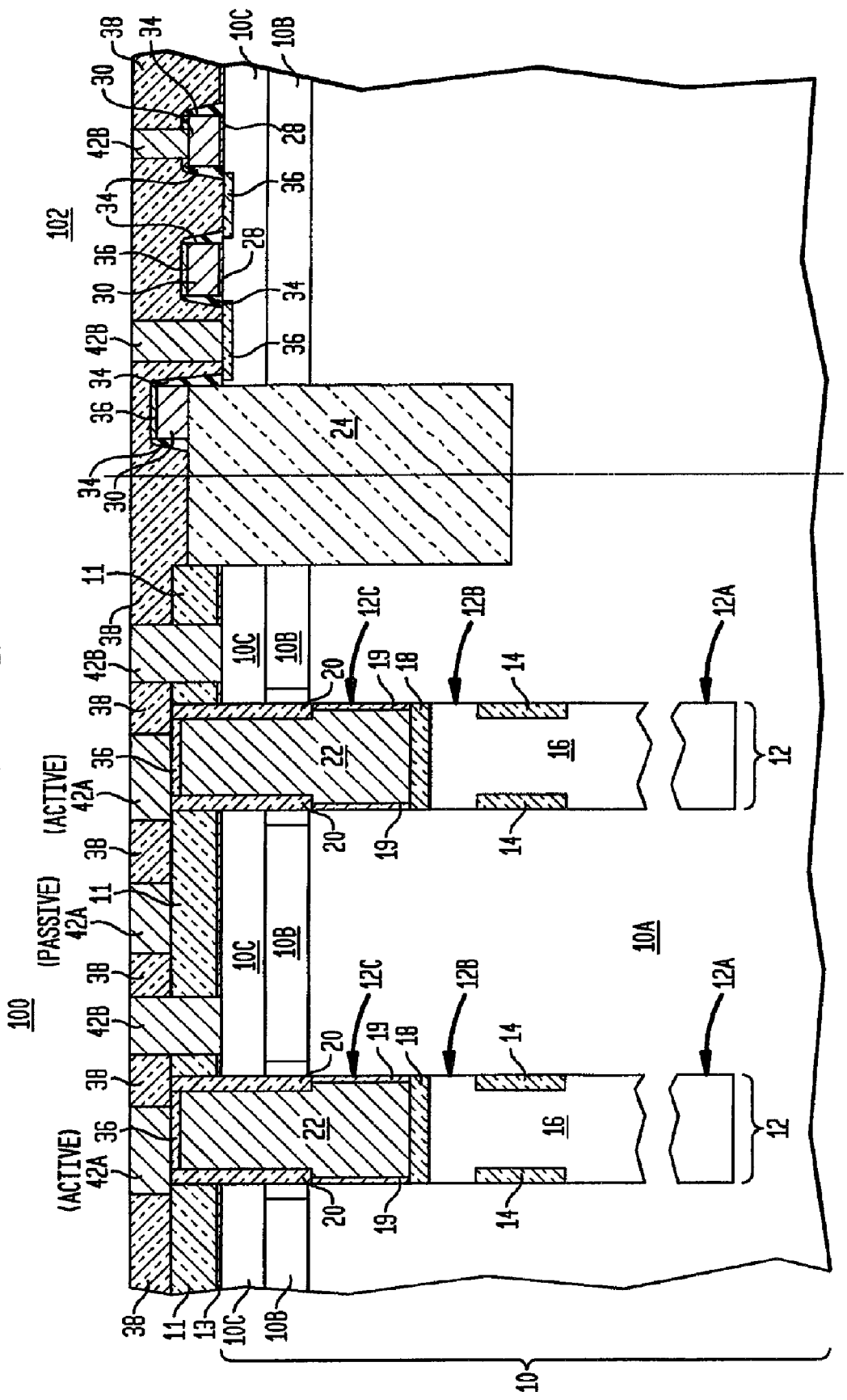
Figure 2:
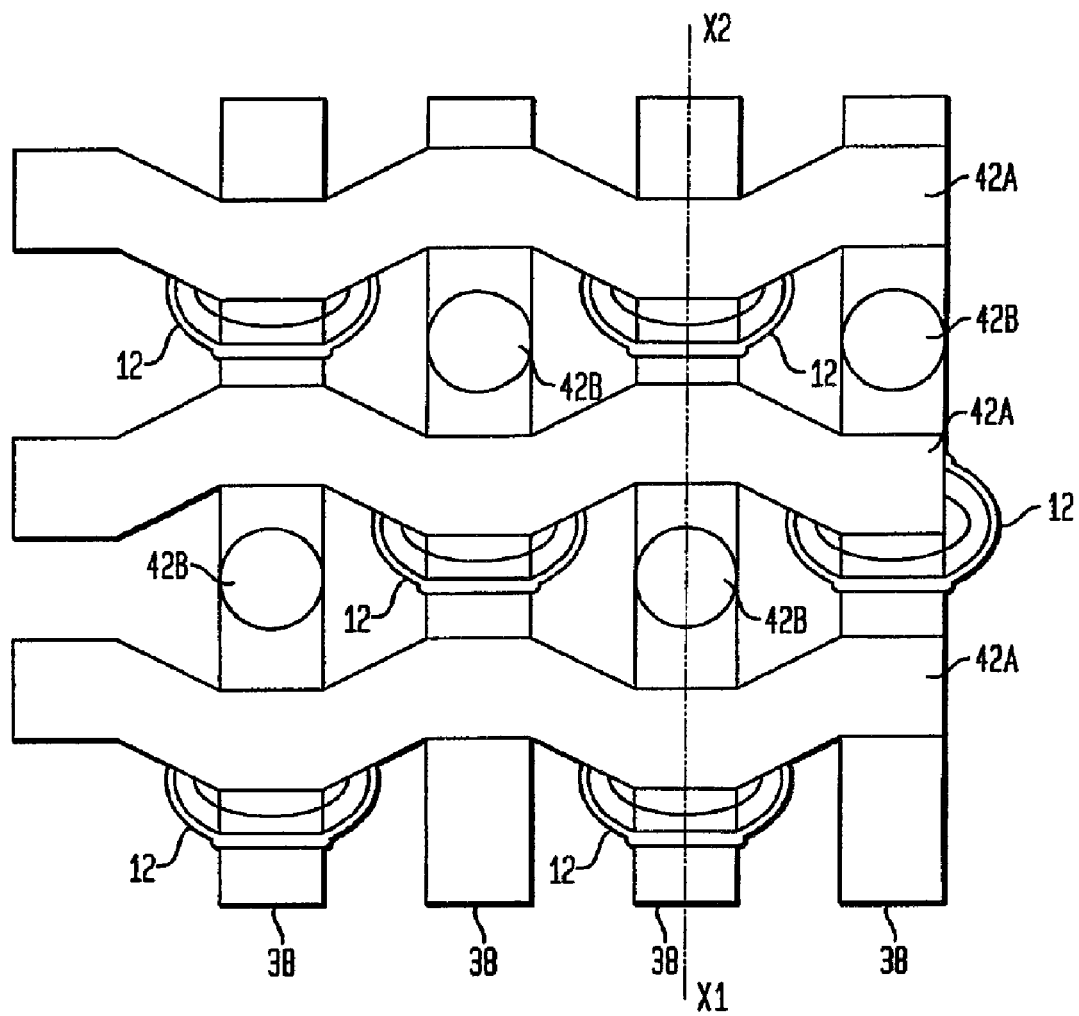
FIG. 2 is a pictorial representation (through a top down view) illustrating the structure shown in FIG. 1H; note that FIGS. 1A-1H are cross sections through X1-X2

FIG. 1H shows the structure after a conductive material 42A and 42B is formed into the openings 40A and 40B. FIG. 2 shows a top down view of the structure shown in FIG. 1H. In FIG. 1H and FIG. 2, reference numeral 42A denotes the wordlines, while reference numeral 42B denotes the metal contacts. As indicated above, the wordlines 42A above the deep trenches 12 are active wordlines, while the wordline 42A above the pad nitride 11 is a passive wordline.

Figure 1I:
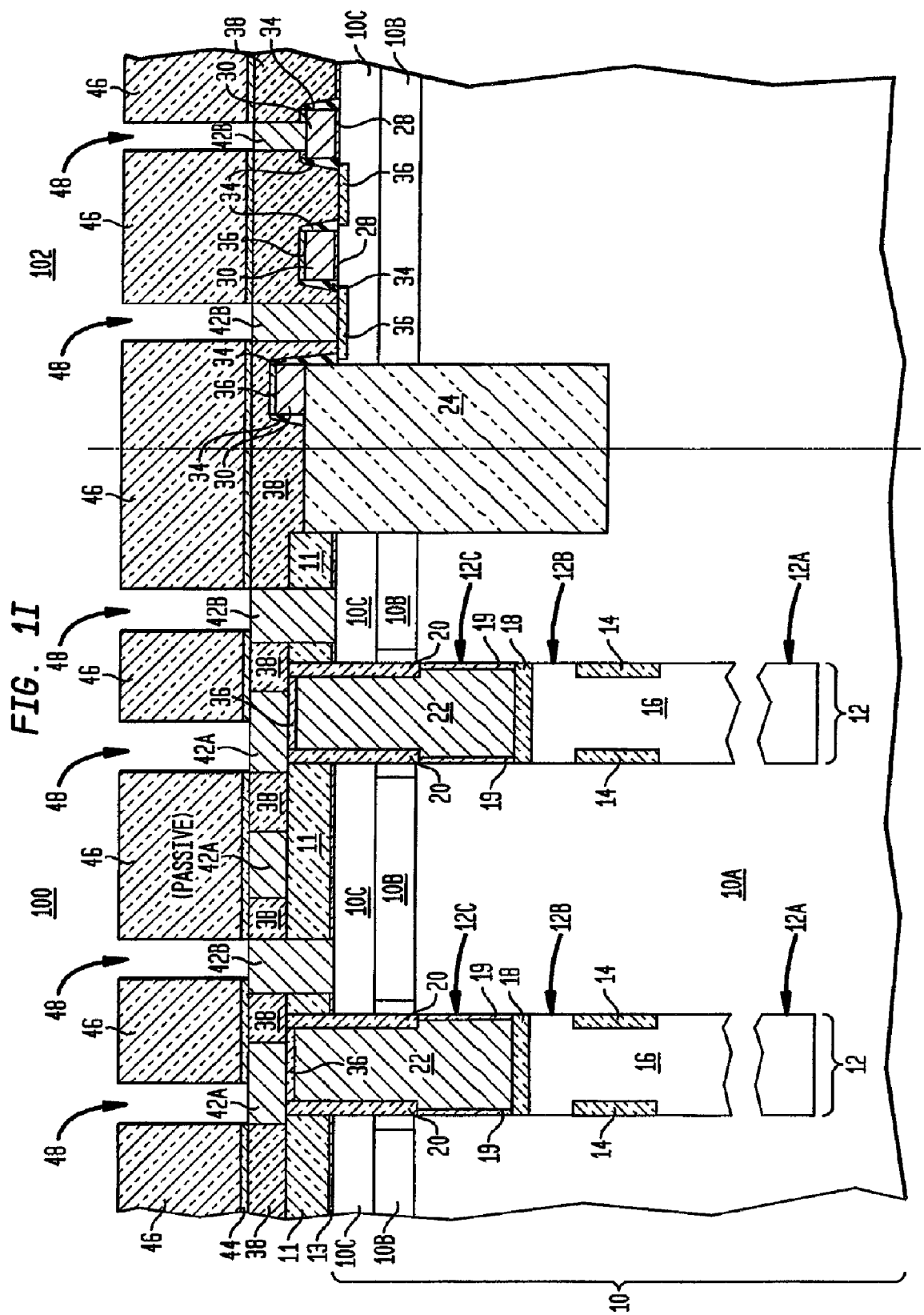

FIG. 1I shows the structure after further processing steps including forming a material stack comprising a nitride 44 and oxide 46 on the structure shown in FIG. 1H and forming openings 48 that extend to selective portions of conductive material 42A and 42B. The openings 48 are formed by lithography and etching. Conventional logic processing steps can then be performed.

Figure 3A:
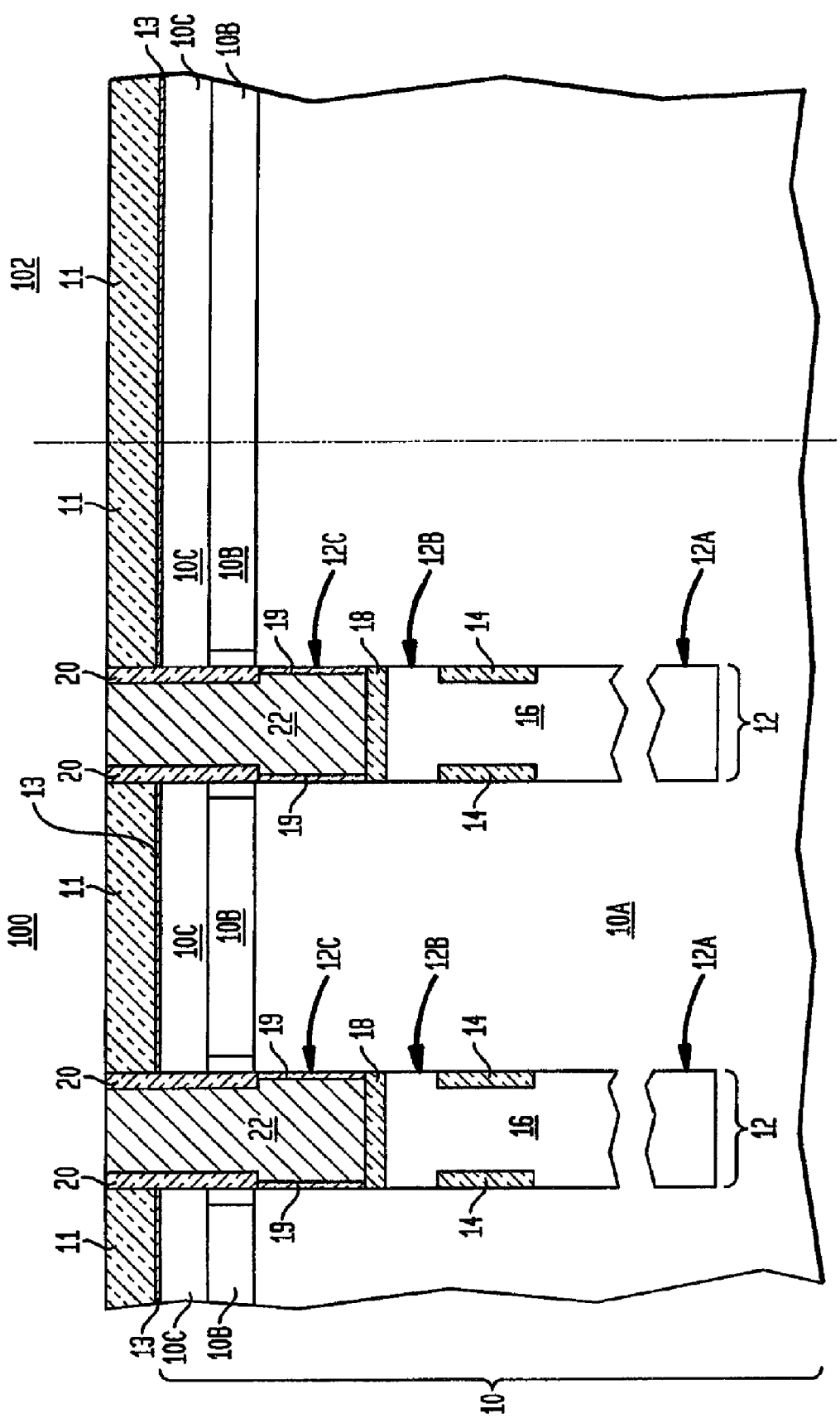

FIGS. 3A-3I illustrate a second embodiment of the present invention. In the second embodiment, oxide gate spacers 20 are used in place of nitride gate spacers 20 shown in FIG. 1A. Specifically, the second embodiment begins with providing the initial structure shown in FIG. 3A. The initial structure shown in FIG. 3A is identical to the initial structure shown in FIG. 1A except for the replacement of the nitride gate spacers 20 with the oxide gate spacers 20. The presence of the oxide gate spacers 20 prevents spacer etchout during subsequent etching of the pad nitride 11 in the array region 100.

Figure 3B:
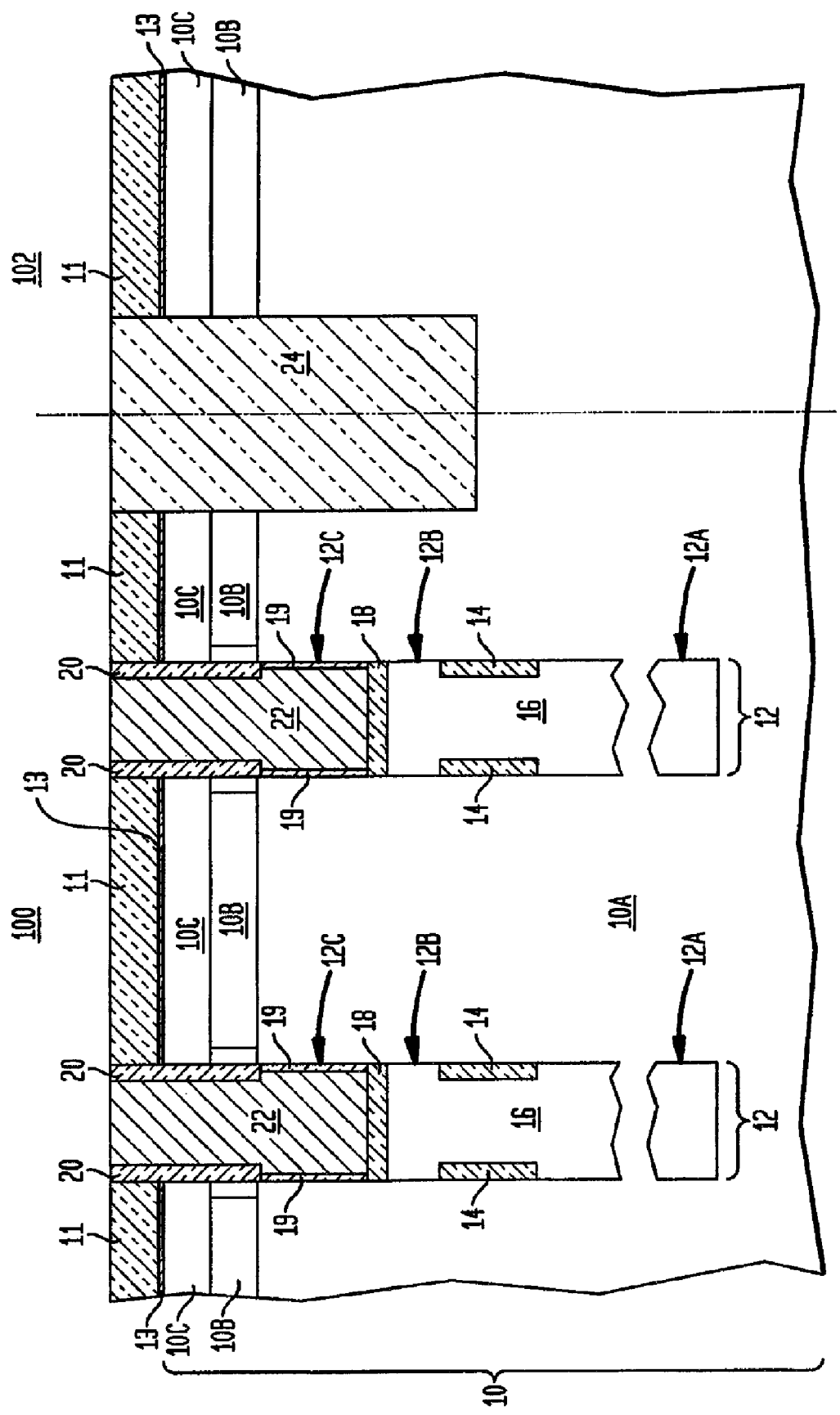

FIG. 3B shows the structure after a trench isolation region 24 is formed between the array region 100 and the support region 102. The trench isolation region 24 is formed utilizing the processing steps described above in connection with the structure shown in FIG. 1B.

Figure 3C:
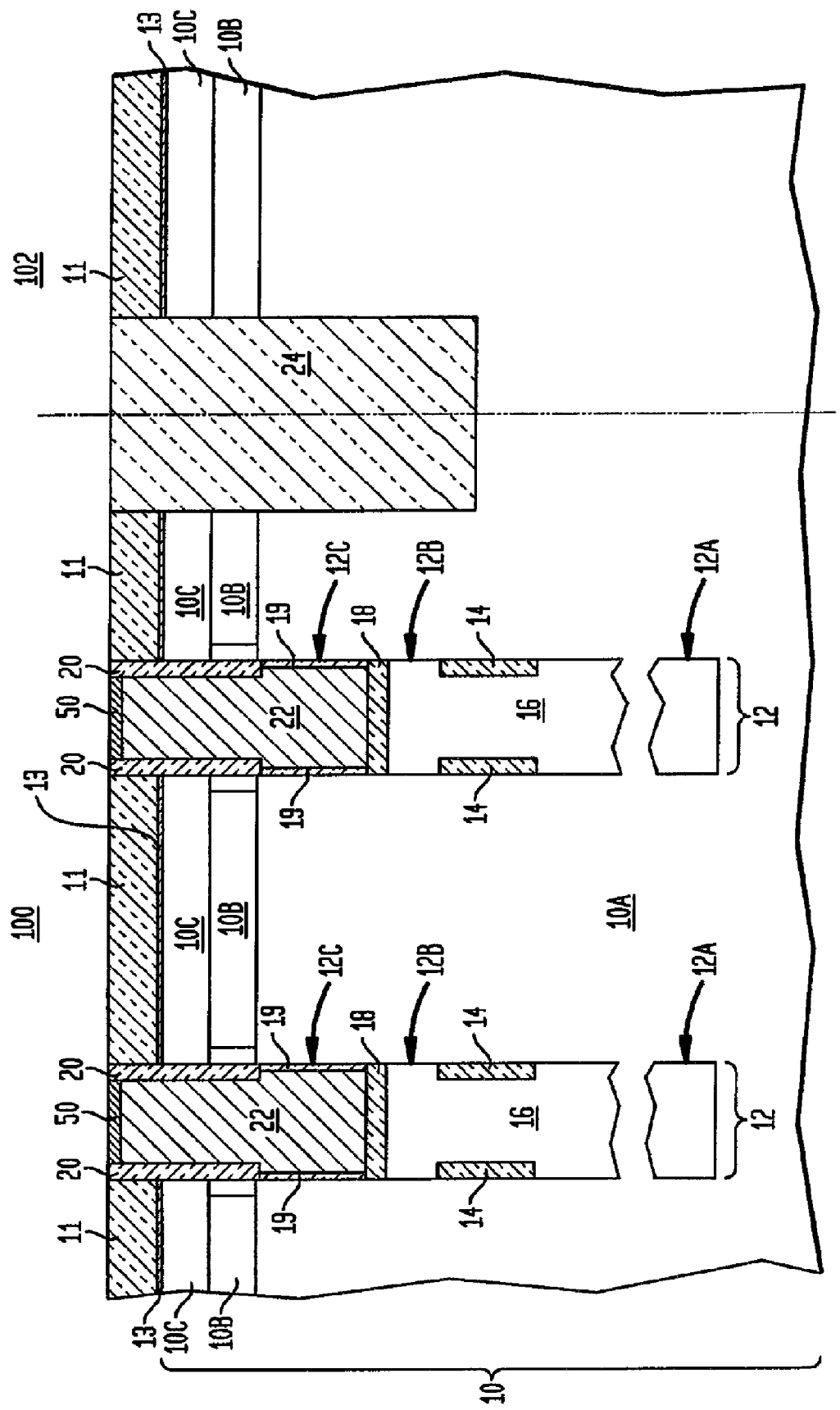

Next, and as shown in FIG. 3C, a conductive cap layer 50 is formed on the exposed surfaces of the trench gate conductor 22 in the array region 100 at this point of the present invention. In one embodiment, the conductive cap layer 50 is a conductive metal such as W, Ir, Ru, Cu, or Al that is formed by deposition and etching or a damascene process which includes polysilicon 22 etch, metal deposition, and chemical mechanical polishing. This embodiment is used when a thermal gate dielectric 28 is to be subsequently formed. In another embodiment of the present invention and when the gate dielectric 28 is subsequently formed by chemical means, the conductive cap layer 50 is formed by a silicidation process.

FIG. 3D shows the structure after deglazing, block mask 26 formation and removal of pad nitride 11 from the support region 102. These steps are the same as described above in the first embodiment for fabricating the structure shown in FIG. 1C. Thus, the above remarks concerning deglazing, block mask 26 formation and selective removal of pad nitride 11 from the support region 102 are incorporated herein by reference.

Figure 3E:
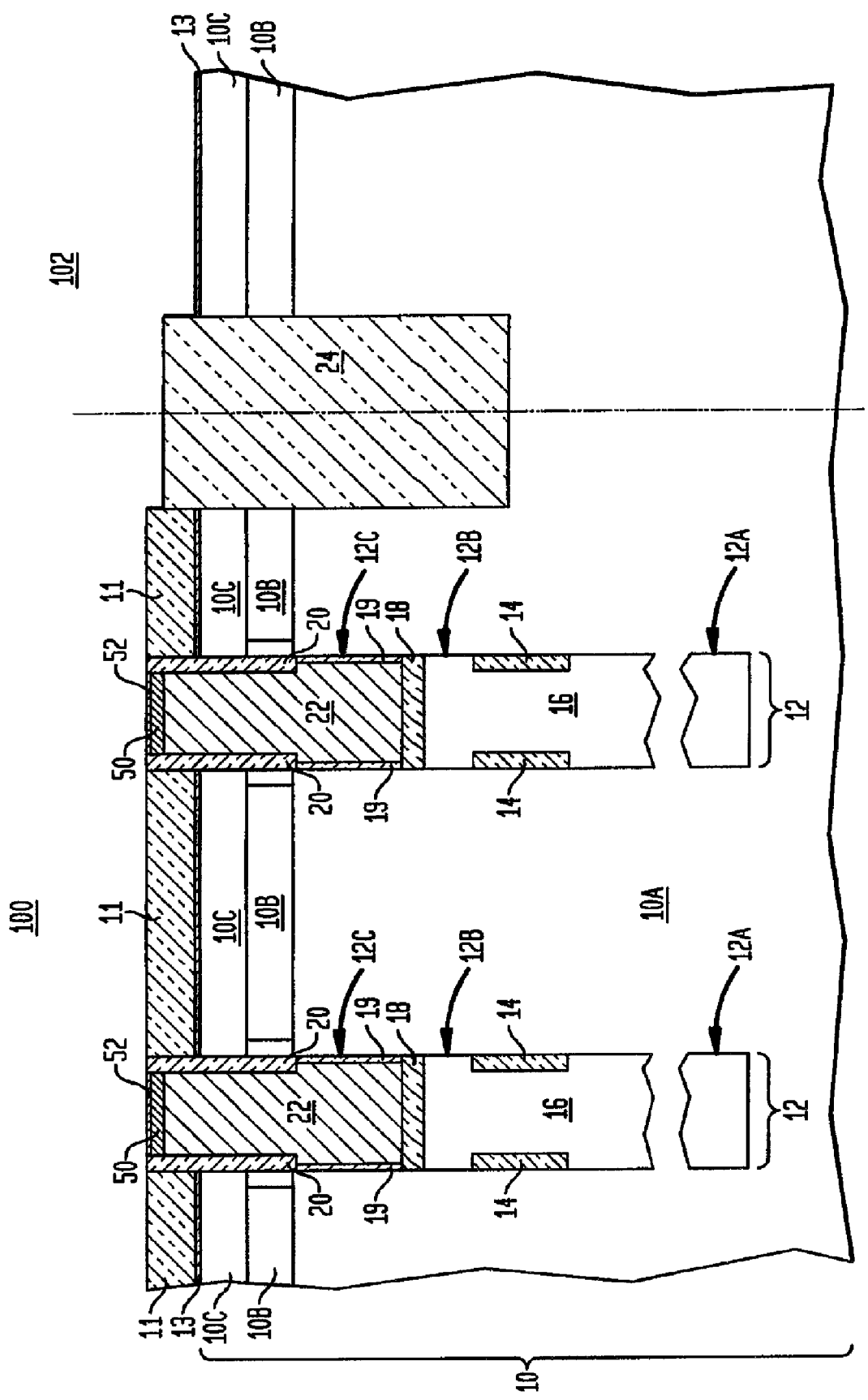
Figure 36:
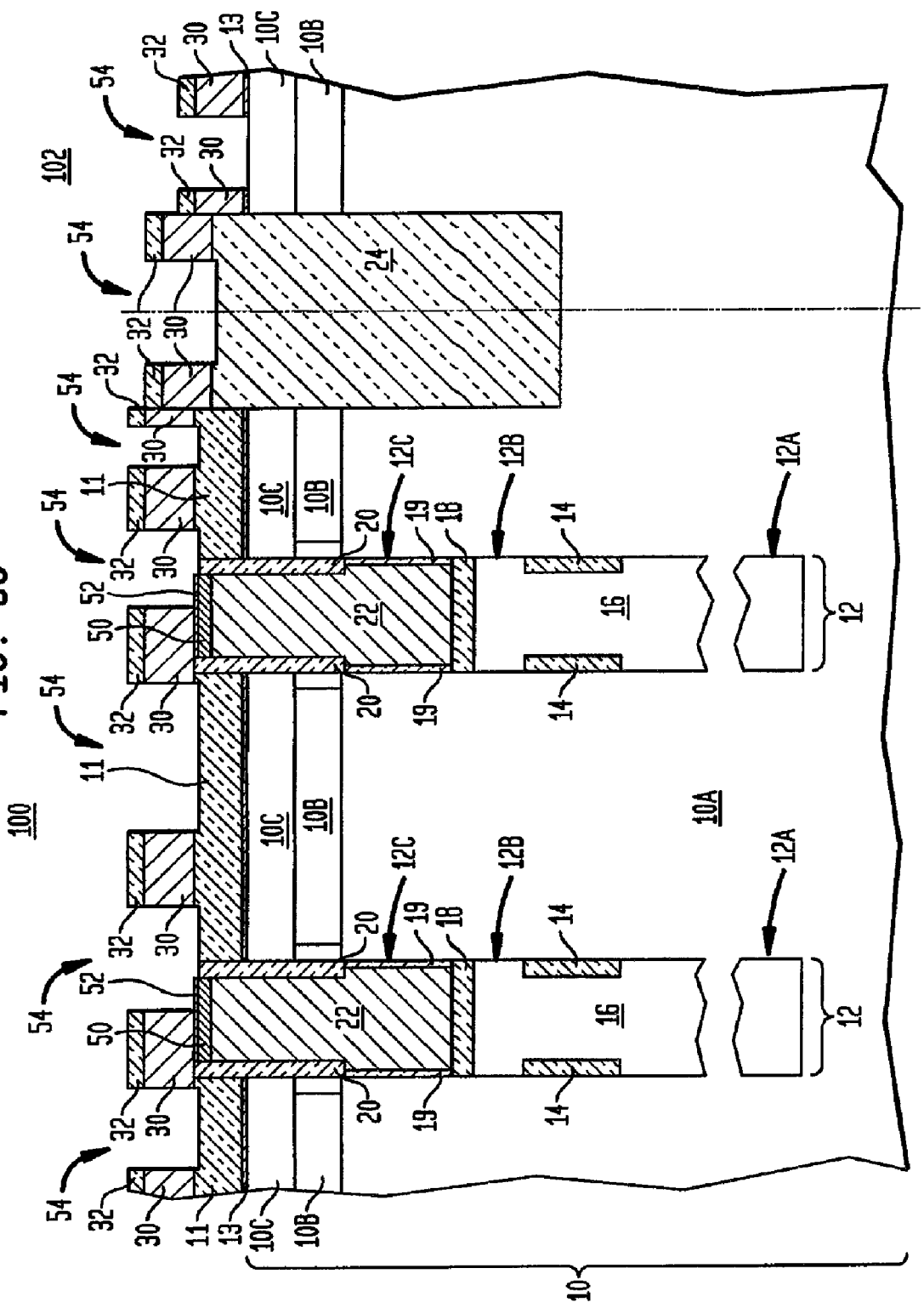
Figure 3H:
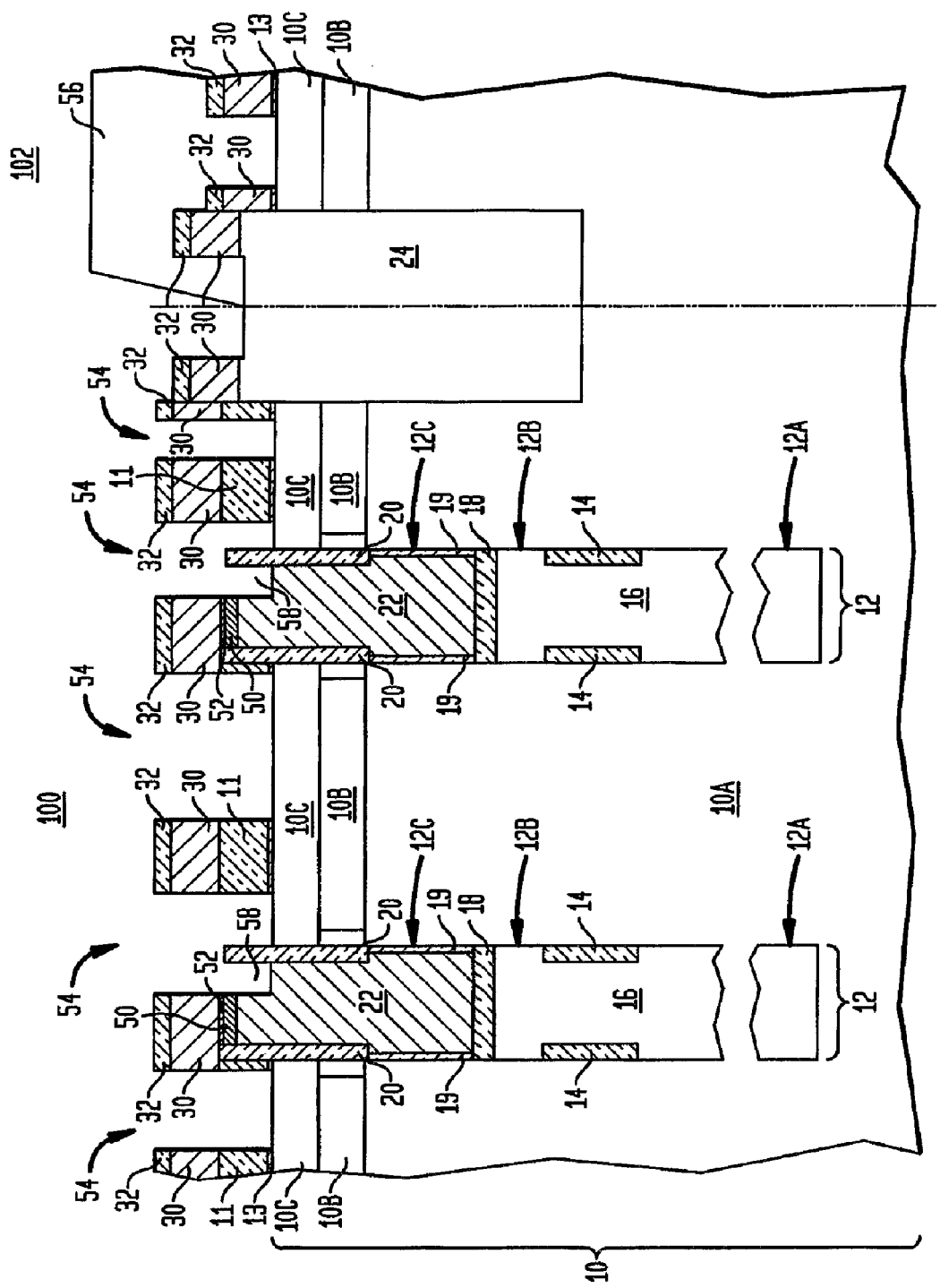

Next, the pad oxide 13 is removed, a sacrificial oxide (not shown) is formed on the structure shown in FIG. 3D and then implants are formed into the support region 102 as described above. Alternatively, pad oxide 13 remains on the support region 102 during the implanting step and it is thereafter removed. A gate dielectric 28 is then formed. Two embodiments are possible depending on the material of the conductive cap layer 50. In one embodiment and when a metal is used as the conductive cap layer 50, a conductive oxide 52 (such as shown in FIG. 3E) is formed in the array region 100 during formation of a gate oxide dielectric 28 in the support region 102. The gate oxide dielectric 28 can be grown at between 650° C. and 900° C. in an $O_2$, NO, or $N_2O$ ambient using rapid thermal processing or furnace processing. When layer 50 is a silicide, a gate dielectric 28 is not formed in the array region 100 and a chemical deposition technique is used in forming the gate dielectric 28 in the support region 102. The gate oxide dielectric 28 can be chemically grown using a conventional gate wet cleaning process such as SC1 and SC2 followed by ozone oxidation at less than 100° C.

FIG. 3F shows the structure after the gate conductor 30 and hardmask 32 are formed on the structure shown in FIG. 3E. The gate conductor 30 and hardmask 32 are formed as described above in the first embodiment of the present invention.

Next, the hardmask 32 is patterned by lithography to expose portions of the gate conductor 30 in both the array region 100 and the support region 102 and then the pattern is transferred from the patterned hardmask 32 to the exposed portion of the gate conductor 30 utilizing an etching step. The structure shown in FIG. 3G includes openings 54 which expose portions of the pad nitride 11 in the array region 100 and the semiconductor substrate 10 in the support region. In the array region 100, portions of layer 52 or layer 50, if layer 52 is not present, atop the deep trenches 12 are exposed. The opening 54 located atop the trench isolation region 26 exposes the surface of the trench dielectric.

Next, the exposed portions of layer 52 and/or layer 50 over the deep trench 12 in the array region 100 is removed using one or more etching processes that selectively removes metal oxide and/or conductive material. In one embodiment in which the conductive material 50 is a metal, reactive ion etching using chlorine and oxygen based chemistries can be used. In another embodiment in which the conductive material 50 is a silicide, reactive ion etching using chlorine chemistry can be employed. A block mask 56 may be formed prior to etching to protect the support region 102 during the etching step. The use of a block mask 56 in the support region 102 helps to reduce poly conductor ACLV (Across Chip Line Variation) in the support region 102.

The above etch stops onto the polysilicon material 22 within the deep trench. A timed etching process such as RIE that selectively removes polysilicon is then used to provide a recess 58 in the deep trench 12 in the array region 100. The exposed portions of the pad nitride 11 in the array region 100 are removed utilizing an etching process that selectively removes nitride, stopping on the pad oxide 13 in the array region 100. Another etching process is used to selectively remove the exposed pad oxide 13 stopping on semiconductor substrate 10. The block mask 56 is then stripped providing the structure shown in FIG. 3H. It is noted that the conductive material 30 atop the recessed deep trench 12 is the active wordline of the inventive structure. The passive wordline that is adjacent to the active wordline is that portion of conductive material 30 that lies above the active area 10C of the substrate 10.

Figure 3I:
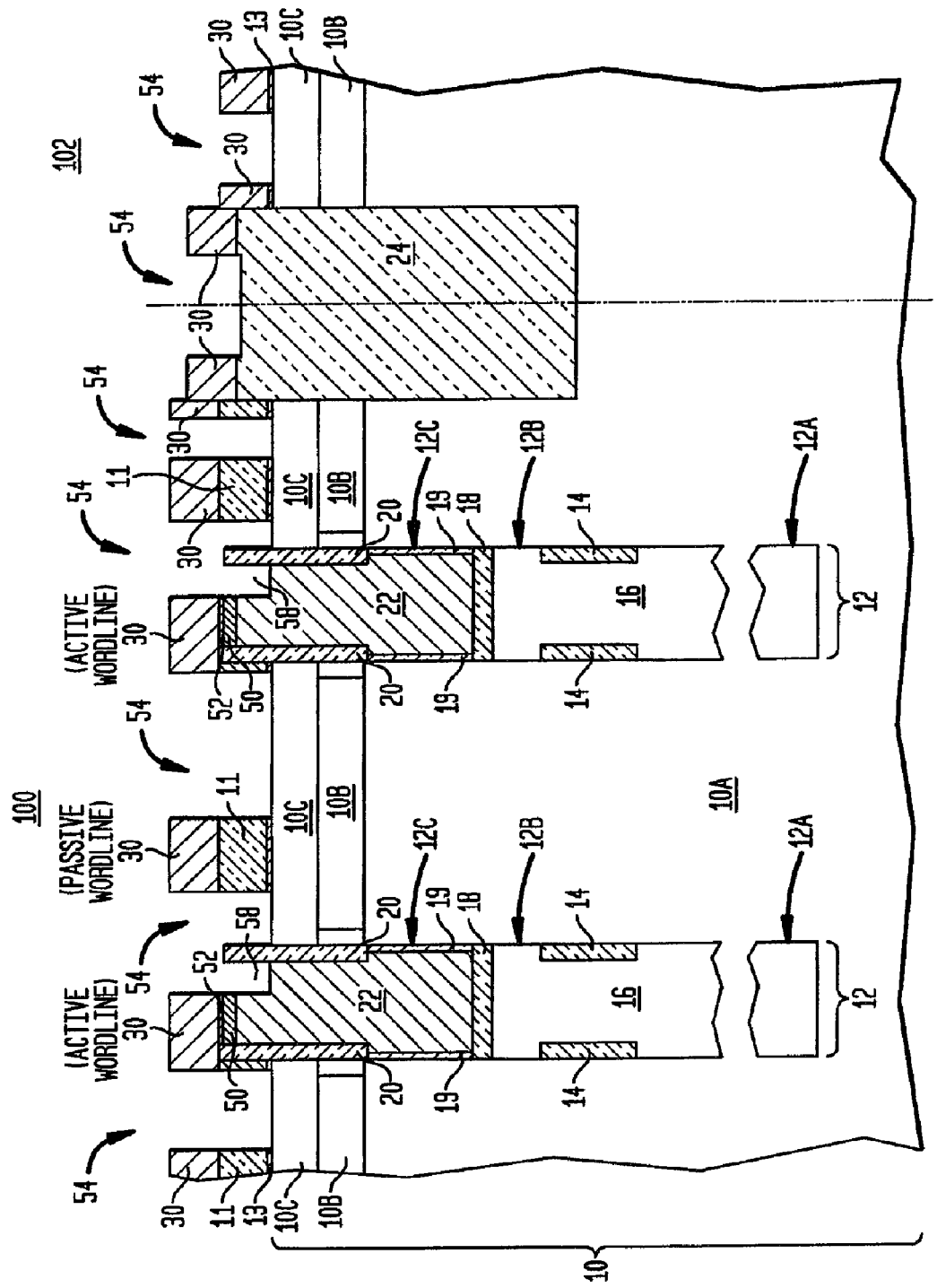

FIG. 3I shows the structure after removing the remaining hardmask 32 utilizing a conventional hardmask etching process. A sidewall oxidation (not specifically shown) is then performed and thereafter standard logic processing is performed on the structure shown in FIG. 3I.

While the present invention has been described in an illustrative manner, it should be understood that the terminology used is intended to be in a nature of words of description rather than of limitation. Furthermore, while the present invention has been described in terms of a preferred and several alternate embodiments, it is to be appreciated that those skilled in the art will readily apply these teachings to other possible variations of the invention.

What is claimed is:

1. A semiconductor structure comprising:
a semiconductor substrate including at least one array region and at least one support region, said semiconductor substrate having an upper active area;
a semiconductor memory device including a trench gate conductor, a silicide region vertically abutting said trench gate conductor, and a gate spacer laterally abutting said silicide region and said trench gate conductor, wherein said trench gate conductor and said gate spacer are located in a deep trench that is present in said semiconductor substrate in each array region;
a dielectric material layer located above and vertically abutting said silicide region and said gate spacer;
an active wordline located above said semiconductor memory device and embedded in said dielectric material layer, wherein said active wordline laterally abuts sidewalls of said dielectric material layer and vertically abuts said silicide region; and
a passive wordline located above said upper active area and embedded in said dielectric material layer and within said at least one array region, wherein said passive wordline laterally abuts sidewalls of said dielectric material layer.

2. The semiconductor structure of claim 1 wherein said semiconductor substrate comprises a bulk semiconductor.

3. The semiconductor structure of claim 2 wherein said semiconductor substrate is a silicon-on-insulator and said active area is a top Si-containing layer of said silicon-on-insulator.

4. The semiconductor structure of claim 1 wherein said active and passive wordlines comprise a conductive material.

5. The semiconductor structure of claim 1 wherein said at least one array region is separated from said at least one support region by an isolation trench region.

6. The semiconductor structure of claim 1 wherein said at least one support region comprises at least one field effect transistor on said upper active area.

7. The semiconductor structure of claim 1 wherein said gate spacer comprises an oxide or a nitride.

8. A semiconductor structure comprising:
a semiconductor substrate including at least one array region and at least one support region, said semiconductor substrate having an upper active area;
a semiconductor memory device including a trench gate conductor, a conductive cap layer vertically abutting said trench gate conductor, and a gate spacer laterally abutting said conductive cap layer and said trench gate conductor, wherein said trench gate conductor and said gate spacer are located in a deep trench that is present in said semiconductor substrate in each array region;
an active wordline located on and above said conductive cap layer;
a first stack of a first pad oxide portion and a first pad nitride portion located underneath and vertically abutting said active wordline and laterally abutting said gate spacer;
a second stack of a second pad oxide portion and a second pad nitride portion located above and vertically abutting said upper active area and not abutting said gate spacer or said active wordline; and
a passive wordline located above vertically abutting said second stack.

9. The semiconductor structure of claim 8, wherein said semiconductor substrate comprises a bulk semiconductor.

10. The semiconductor structure of claim 8, wherein said semiconductor substrate is a silicon-on-insulator and said active area is a top Si-containing layer of said silicon-on-insulator.

11. The semiconductor structure of claim 8, wherein said active and passive wordlines comprise a conductive material.

12. The semiconductor structure of claim 8, wherein said active wordline vertically abuts said conductive cap layer.

13. The semiconductor structure of claim 8, further comprising a conductive oxide layer vertically abutting said active wordline and said conductive cap layer.

14. The semiconductor structure of claim 8, wherein said at least one array region is separated from said at least one support region by an isolation trench region.

15. The semiconductor structure of claim 8, wherein said at least one support region comprises at least one field effect transistor on said upper active area.

16. The semiconductor structure of claim 8, wherein said semiconductor memory device comprises an upper recessed portion that has a height below a non-recessed portion.

17. The semiconductor structure of claim 8, wherein said gate spacer comprises an oxide or a nitride.

* * * * *